(12) United States Patent
Jordy

(10) Patent No.: US 7,233,165 B2
(45) Date of Patent: Jun. 19, 2007

(54) HIGH SPEED DRIVER FOR SERIAL COMMUNICATIONS

(75) Inventor: George Jordy, Hopewell Junction, NY (US)

(73) Assignee: Seiko Epson Corporation, Tokyo (JP)

( * ) Notice: Subject to any disclaimer, the term of this patent is extended or adjusted under 35 U.S.C. 154(b) by 142 days.

(21) Appl. No.: 11/095,882

(22) Filed: Mar. 31, 2005

(65) Prior Publication Data

US 2006/0220685 A1 Oct. 5, 2006

(51) Int. Cl.
*H03K 17/16* (2006.01)
*H03K 5/22* (2006.01)

(52) U.S. Cl. .......................... 326/29; 326/26; 326/86; 326/87; 327/65; 327/108; 365/189.05

(58) Field of Classification Search ................. 326/29, 326/26, 86, 87, 91; 327/65, 112; 365/189.05, 365/189.11
See application file for complete search history.

(56) References Cited

U.S. PATENT DOCUMENTS

| | | | |
|---|---|---|---|
| 5,857,001 A | 1/1999 | Preuss et al. | |
| 6,137,322 A | 10/2000 | Eyck | |
| 6,212,229 B1 | 4/2001 | Salinger | |
| 6,313,682 B1 | 11/2001 | Muller, Jr. et al. | |
| 6,362,656 B2 | 3/2002 | Rhee | |
| 6,393,062 B1 | 5/2002 | Furman et al. | |
| 6,400,616 B1 | 6/2002 | Tamura et al. | |
| 6,466,626 B1 | 10/2002 | Cecchi et al. | |
| 6,518,792 B2 | 2/2003 | Jong et al. | |
| 6,956,407 B2 * | 10/2005 | Baig et al. | 327/65 |
| 2005/0093580 A1 * | 5/2005 | Baig et al. | 327/65 |

* cited by examiner

*Primary Examiner*—Daniel D. Chang
(74) *Attorney, Agent, or Firm*—Rosalio Haro

(57) ABSTRACT

A differential output driver capable for selectively switching from an emphasis mode, a non-emphasis mode, and an idle state uses one pull-up device and two pull-down devices per output lead. The pull-up device is preferably always activated, and one or the other or both or neither of the pull-down devices are selectively activated to provide a desired behavior. Neither pull-down device is strong enough to singularly overcome the pull-up device and fully pull down an output lead to an emphasis logic low level. One of the pull-down devices is singularly strong enough to bring an output lead to a non-emphasis logic low level, which is higher than an emphasis logic low level. The other pull-down device is singularly strong enough to pull an output line from an emphasis logic high level to a non-emphasis logic high level. Working together, however, both devices can pull-down an output lead to an emphasis logic low level. Thus, when a non-emphasis logic high output is desired, the weak pull-down device is actuated. To output a non-emphasis logic low level, the strong pull-down device is activated. To output an emphasis logic low level, both pull-down devices are activated, and to output an emphasis logic high level, both pull-down devices are deactivated. To provide an idle output voltage level, both pull-down devices are further weakened and both are activated at the same time.

14 Claims, 12 Drawing Sheets
(2 of 12 Drawing Sheet(s) Filed in Color)

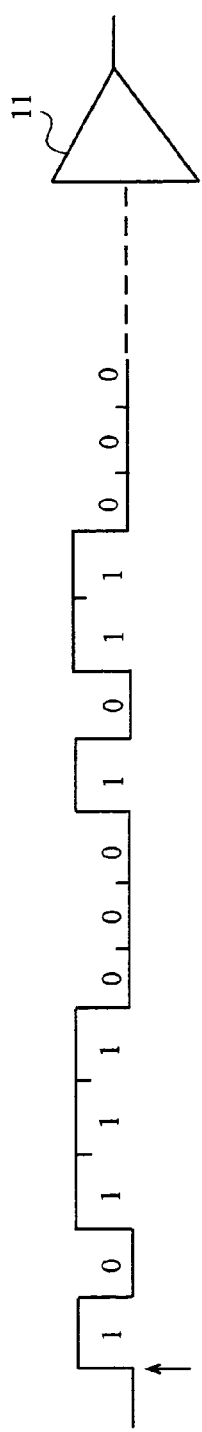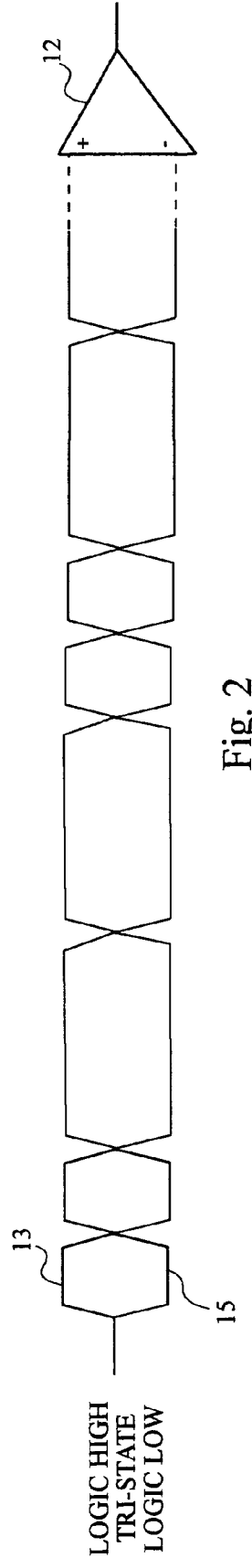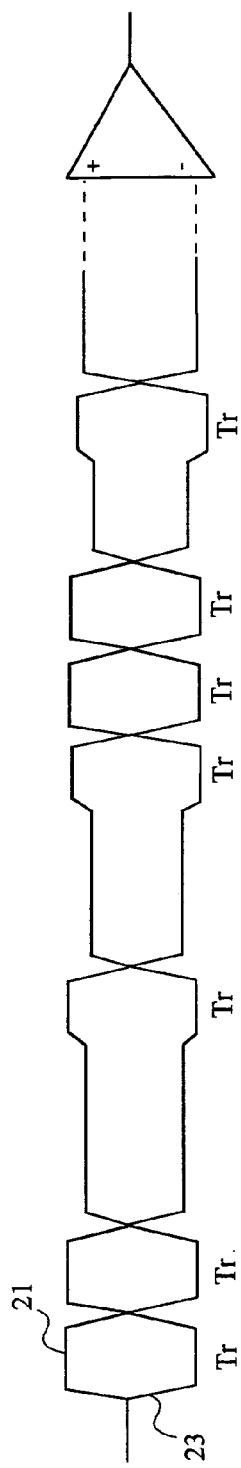
Fig. 1
(Prior Art)
Fig. 2
(Prior Art)
Fig. 3
(Prior Art)

HIGH SPEED DRIVER FOR SERIAL COMMUNICATIONS

BACKGROUND OF THE INVENTION

1. Field of the Invention

The present invention is related to output signal drivers, more specifically to differential signal drivers that have a wave shaping, i.e. emphasis, capability, and further more specifically to a differential output driver suitable for current mode logic, CML, applications.

2. Description of the Related Art

With reference to FIG. 1, a series of binary logic signals transmitted to a receiver buffer 11 may consist of a series of high and low pulses representing logic high and logic low signals, respectively. This typical type of signal transmission uses a single signal line to transmit logic 1's and 0's (i.e. logic high and low signals) by means of voltage high (such as VCC) and voltage low (such as GND) levels. Although simple to implement, this type of signal transmission deteriorates as transmission frequencies and/or the communication lines are increased.

To improve transmission integrity and signal recovery, differential signal transmissions can be used, as depicted in FIG. 2. In this case, two lines are used to transmit a logic signal. A first line transmits the true logic form 13 of a logic signal and a second line transmits the complementary logic form 15 of the signal. Both lines are applied to the input of a differential amplifier 17 at the receiver end of the transmission. Since the differential amplifier 17 can discern a received logic signal by comparing the relative voltages of the two signal lines and determining which of the two lines is at a higher potential, it is not necessary for either line to maintain a fully logic high voltage level (VCC) or a fully logic low voltage level (GND) all the way along the transmission line to receiver 17. Therefore, differential communication systems can achieve higher frequencies and longer communication lines than can single-end communication systems. As frequencies are increases even further, however, this implementation of a typical differential transmission system also begins to experience signal deterioration and signal recovery issues.

High frequency designs, i.e. in the gigahertz range, are challenging because of second order effects in the physical transmission medium, i.e. the transmission lines themselves. These second order effects can be neglected at lower frequencies but are dominant at higher frequencies. Transmission line skin effect, dielectric loss and discontinuities due to geometry changes in the signal lines all contribute to signal degradation, i.e. to altering the shape of the traveling wave. One way of mitigating these degenerative affects of the physical medium is to shape the driven signal pulses (from an output driver) in such a way as to produce a better signal to noise ratio at the receiving end.

It has been found that the success rate of signal recovery can be increased by implementing a technique known as emphasis, or pre-emphasis, (i.e. a wave shaping technique implemented at the output driver side of a driver-receiver communication pair for better signal recovery at the receiver side). Although emphasis techniques can be applied to single-ended transmission systems, it is most often associated with differential signal transmission systems.

Multiple emphasis application techniques are known, but a common emphasis technique improves signal recovery by increasing the voltage (and/or current) level of a transmitted logic signal at logic transitions. For example in FIG. 3, a transmitted true logic signal 21 and its complementary logic signal 23 are given an increased in voltage magnitude at logic transitions (i.e. when transitioning from a logic "1" to a logic "0", and vise-versa, as exemplarily shown following the logic transitions of FIG. 1 from right to left). These logic transitions are identified by label "Tr" in FIG. 3. If no logic transition occurs in successive signal transmissions, emphasis shaping is removed (i.e. the voltage swing levels return to non-emphasis levels) until the next logic transition.

In FIG. 3, the right-side of the pulse train represented earlier transmitted pulses traveling toward differential amplifier 19, and the left side of the pulse train represent more recently transmitted signals placed on the communication line by a signal transmitter, not shown. Thus, looking at the pulse train from right to left (i.e. from earlier transmissions to more current transmissions), one can identify pulses where logic transitions took place, as identified by label Tr. For example, the last four logic signal pulses shown at the left-side (i.e. the transmitter side) of the pulse train are "1 0 1 1", and thus experienced no logic transition between the earliest-two consecutive 1's, but did experience a logic transition at the most recent two pulses, "1 0". The magnitudes of the voltage high and voltage low levels of the logic transitions are therefore increased, i.e. emphasized, or pre-emphasized. However, when no logic transitions occur in consecutive signal pulses, such as those pulses not identified by the label "Tr", the magnitudes of the voltage high and voltage low levels are reduced to lower magnitude levels.

To further clarify the benefits of applying emphasis to signals at high frequencies, FIG. 4 illustrates a setup for analyzing the ill-effects of high frequency differential signal transmissions on real, i.e. physical, transmission lines. Transmission lines 14 and 16 are symbolically represented by boxes assigned attributes consistent with the electrical characteristics of a physical transmission line, such as assigning it a resistive value of 50Ω and any appropriate reactive values, if desired. Similarly, a ground plane 12 is represented a pair of boxes assigned appropriate electrical attributes. A signal driver (not shown) applies differential signals via transmitting leads 14a and 16a at the left side of transmission lines 14 and 16, respectively. The applied differential signals travel the length of transmission lines 14 and 16 until reaching receiving leads 14b and 16b and being applied to a receiver (not shown) at the right side of transmission lines 14 and 16. As is customary, 50Ω terminating resistors 18 and 20 couple receiving leads 14b and 16b to ground to reduce signal reflection and maximize the signal-to-noise ratio. In the present discussion, an ideal differential pulse waveform applied to transmitting leads 14a/16a and observed at receiving leads 14b/16b will be compared with an emphasis-shaped waveform also applied to transmitting leads 14a/16a and likewise observed at receiving leads 14b/16b.

In FIG. 5, examples of an ideal differential pulse signal and an emphasis-shaped differential signal for application to transmitting lead 14a/16a are given different DC voltage offsets for the sake of clarity, so as to avoid overlapping the ideal and emphasis-shaped signals. This DC offset is not critical to the present explanation. The lower set of waveforms, i.e. waveforms 20a and 22a, represent true and complement differential signals from an ideal source, not shown, driven onto transmission lines 14 and 16. The upper set of waveforms, i.e. waves 24a and 26a, represent true and complement differential signals from a driver circuit that shapes the pulses in a controlled manner, i.e. applies emphasis shaping.

An ideal transmission line would only delay a signal by the time it takes the signal to traverse the length of the transmission line, and would not change the shape of the traversing signal. However, this is not the case in a real (i.e. physical) transmission line, particularly when transmitting signals at very high frequencies. In a physical transmission line, a transmitted signal will suffer degradation and have its shape altered as it traverses the transmission line.

With reference to FIG. 6, the lower set of waveforms, 20b and 22b, indicate the shape of the true and complement signals (20a/22a from FIG. 5) issued by the ideal source once they have traversed transmission lines 14/16 and arrived at receiving leads 14b and 16b (FIG. 4). The upper set of waveforms, 24b and 26b, indicate the shape of the true and complement signals 24a and 26a issued by a pulse shaping driver (i.e. with emphasis) after they have traversed transmission lines 14/16 and arrived at receiving leads 14b/16b. As explained above, each set of received complementary signals 20b/22b and 24b/26b would be applied to respective receivers (such as differential amplifiers), which would attempt to recover the transmitted data. However, since both sets of signals 20b/22b and 24b/26b are distorted (i.e. have had their shapes altered as they traversed transmission lines 14 and 16) it is not readily apparent which set of waveforms the receivers would be better able to read and properly recover transmitted data. In other words, it is not clear which set of received waveform signals is of better quality.

One way to discern the quality of received differential signals is to plot an eye diagram of the difference between the true and complement signals in each set of waveforms. FIG. 7 shows two eye diagrams respectively constructed from the two sets of complementary signals 20b/22b and 24b/26b at the receiver end of the transmission line. The construction of an eye diagram is best understood by explaining how it is generally constructed in the field. The base band waveform is typically connected to an oscilloscope whose time base is triggered by the receiver sampler timing once each P seconds. A long sequence of random data is then fed to the transmitter. The result is a supposition of the possible P-second transitions in the waveform, which form a pattern that resembles an eye. As long as the eye is "open", one can recover the transmitted data, but if the eye is closed, then it is not possible to recover the transmitted data. Thus, the quality of a received signal can be gauged by a determination of how open its resultant eye pattern is.

In FIG. 7, the left diagram is from signals (waveforms 20b/22b in FIG. 6) received from the ideal source (ideal pulse waveforms 20a/22a in FIG. 5), and the right diagram is from signals (waveforms 24b/26b in FIG. 6) received from the wave-shaping driver (emphasis waveforms 24a/26a in FIG. 5). The diagrams cover 3 data bit periods of 400 ps each for a total of 1.2 ns. It can be seen that in the left diagram no eye is visible, i.e. the eye is "closed", meaning that the ideal square pulses are degraded to such an extent that no discernable data signal can be recovered at the receiving end of the transmission line. The right diagram shows that the emphasis-shaped signals (i.e. the shaped pulses) produce an opened eye 38 in the diagram meaning that the receiver can definitely recover the transmitted signal. The amount of improvement in the received signal is a function of the transmission line and the amount/type of emphasis of the shaped signal.

In the past, circuits for implementing wave-shaping (i.e. emphasis or pre-emphasis) techniques have typically required control logic circuitry having registers and logic comparators to compare a current logic output at the signal driver with a previous logic output in order to identify logic transitions and to determine if emphasis should be applied.

Also in the prior art, the output driver itself was typically comprised of two separate, and independent, output driver circuits, one that provided emphasis output voltage levels, and another that provided non-emphasis (i.e. reduced) output voltage levels. The control logic circuitry would select one or the other (or both) of the output drivers depending on whether emphasis should be applied.

For example in FIG. 8, in a prior art pre-emphasis transmitter (only one of a pair of true or complement lines is shown for simplicity), data to be transmitted is applied directly to a non-emphasis signal driver 30, which provides a reduced voltage swing. The pull-up PMOS transistor and pull-down NMOS transistor of non-emphasis driver 30 are made relatively weak and not able to fully pull-up output line 32 to VCC, or to fully pull-down output line 32 to GND. Consequently, this example provides a second signal driver 34 that is activated when pre-emphasis is desired. By having both the first 30 and second 34 signal drivers working in tandem, the output line 32 receives increased current sourcing/draining capability and is thereby driven all the way up to the logic high power rail and all the way down to the logic low power rail.

As shown, this circuit requires that the data signals to be transmitted be applied to a shift register 36 to keep a record of previously transmitted logic signals. The contents of shift register 36 are applied to a digital comparator 38 to identify logic transitions between previous and current output data signals, and the output of the digital comparator 38 is applied to a pre-emphasis controller 40, which also receives the current data to be transmitted and selectively activates second signal driver 34, as needed.

The use of a shift register and digital comparator complicate and increase the overall structure of the output driver. Furthermore, the pre-emphasis circuit of FIG. 8 is a CMOS based circuit, but CMOS circuitry is often not suitable for very high frequency applications. At very high frequencies, one typically requires current based circuitry, such as current mode logic (CML) circuitry.

OBJECTS OF THE INVENTION

If is an object of the present invention to provide an wave-shaping, emphasis, circuit of simplified structure.

It is another object of the present invention to provide an emphasis circuit suitable for current mode logic circuitry.

SUMMARY OF THE INVENTION

The present invention is a signal driver suitable for differential signal transmission in high frequency (i.e. gigahertz range) applications. The present signal driver further provides a simplified circuit structure for implementing an emphasis technique (i.e. wave shaping at the driver side) for better signal recovery at the receiver side.

Emphasis improves signal recovery by increasing the voltage (or current) level of a logic signal at predetermined points, such as at logic transitions. For example, if a non-emphasized logic high (i.e. logic 1) is typically represented by a voltage level of 3.3V, then a logic high with emphasis may have a voltage level of 4V. Continuing with this example, if a non-emphasized logic low (i.e. logic 0) is typically represented by a voltage level of 1V, then a logic low with emphasis may have a voltage level of 0V.

It has been found that sufficient signal recovery improvement is achieved even if emphasis is applied only at logic transitions of the output signal. For example, if the output signal driver is outputting a string of non-emphasized logic 1's, then the output signal driver would output a non-emphasized voltage high level of 3.3V. Upon transitioning its output to a logic low, the output signal driver would apply emphasis and provide an emphasized logic low level of 0V. Following this logic transition, if the output signal driver continued to output a string of logic 0's, then emphasis would be removed and the output signal driver would provide a non-emphasized logic low level of, for example, 1V. If the output signal driver were to then transition to a logic high, then the signal driver would apply an emphasis logic high level of 4V. Following this, if the output signal driver did not experience another logic signal transition and continued to output a string of logic 1's, then emphasis would be removed and the output voltage would drop to a non-emphasized level high of 3.3V.

To achieve this, the functionality of an output driver in accord with the present invention is split into a first and a second partial output driver each having its respective output tied to a common output line. The first partial output driver is optimized to provide a voltage low output during non-emphasis operation, and the second partial output driver is optimized to provide a voltage high output during non-emphasis. Thus, during non-emphasis operation, one or the other of the two partial output drivers separately drives the output line to provide a logic high or logic low of smaller voltage swing.

Each partial output driver is implemented as an inverting voltage-follower amplifier that structurally may be modeled by a pull-up resistor in series with a control transistor in series with a current sink of predefined strength. The current sinking capability of the first and second voltage-follower amplifiers is thus controlled by respective first and second current sinks of unbalanced strength. That is, the strength of the first current sink may be, for example, three times greater than the strength of the second current sink.

Under non-emphasized operation, the first voltage-follower amplifier is used to apply a non-emphasis logic low on the output line since its stronger first current sink is capable of pulling low the output line in spite of the pull-up resistor. Similarly under non-emphasis operation, the second voltage-follower amplifier is used to apply a non-emphasized logic high since its weaker current sink cannot completely overcome the pull-up resistor and thus the output line remains at a logic high level, but at a voltage lower than VCC, i.e. at a non-emphasis logic high level. In other words, when only the first voltage-follower amplifier is operating, its stronger current sink can apply a non-emphasized logic low voltage on the output line of, for example 1V, but cannot completely pull the output line down to ground. Similarly, when only the second voltage-follower amplifier is operating, its weaker current sink can partially pull-down the output line, but the output line remains at a high logic level potential (albeit lower than VCC) such as 3.3V, for example.

To achieve a larger voltage swing for emphasis operation, both the first and second partial output drivers are made to work together. Their combined operation can cause the output line to fully swing from power rail to the other. That is, when both current sinks are on simultaneously, their combined pull-down action can force an output line all the way down to emphasis levels of, for example, 0V. Similarly when both current sinks are turned off, the pull-up resistor of the inverting amplifier can pull the output all the way to emphasis levels of, for example, Vcc since it is unimpeded by any current sinks. Thus during emphasis, the output line achieves a larger voltage swing of, for example, 0V to 4V.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is bit stream applied to a receiver.

FIG. 2 is a differential representation of the bit stream of FIG. 1 applied to a differential receiver.

FIG. 3 is a differential representation of the bit stream of FIG. 1 with added emphasis applied to a differential receiver.

DESCRIPTION OF THE PREFERRED EMBODIMENTS

The present output driver is suitable for use in a differential output driver, and further suitable for use in current based circuitry, such as current mode logic, CML. As it is known, a differential output driver outputs a true and complement waveform signal on two respective output leads, which together constitute a single data logic signal. For the sake of clarity, the initial explanation will be applied only to half of a differential driver, i.e. the part of the differential output driver that outputs the true component of the differential signal. This would be similar to a single-ended output driver. It is to be understood that the complete differential driver would also include additional complementary circuitry analogous to the circuitry that produces the true signal component, and designed to produce the logic complement of the true signal component. The complete differential output driver is described later in this discussion.

Figure 4:
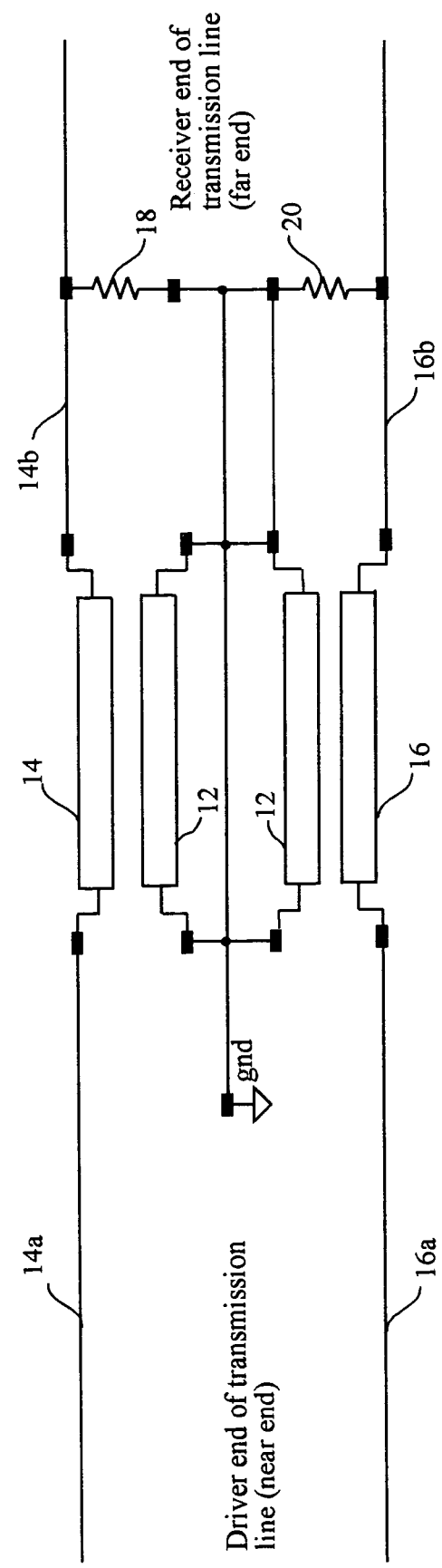
FIG. 4 is a representation of a circuit structure for analyzing pulse distortion in a physical transmission line.
Figure 5:
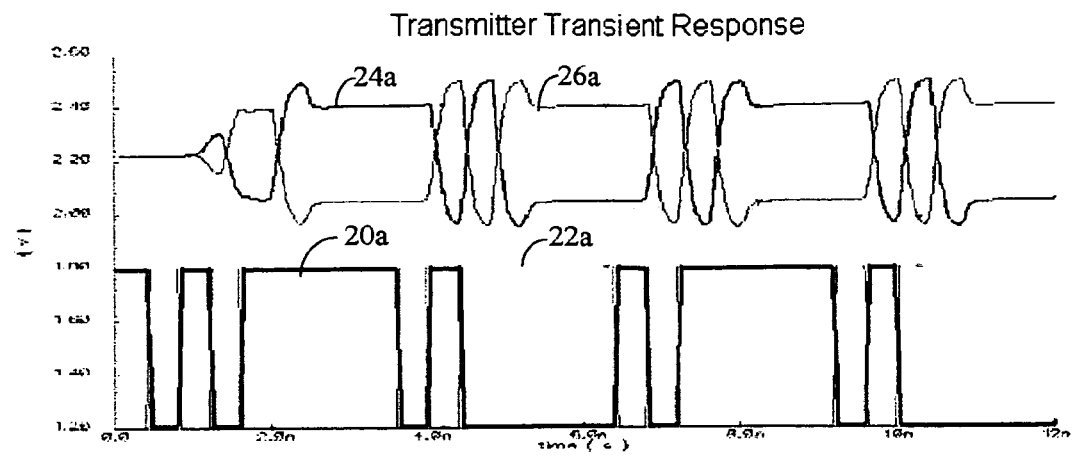
FIG. 5 show a pair of differential transmissions for comparison, one pair of square pulse and one pair of emphasis-shaped pulses.
Figure 6:
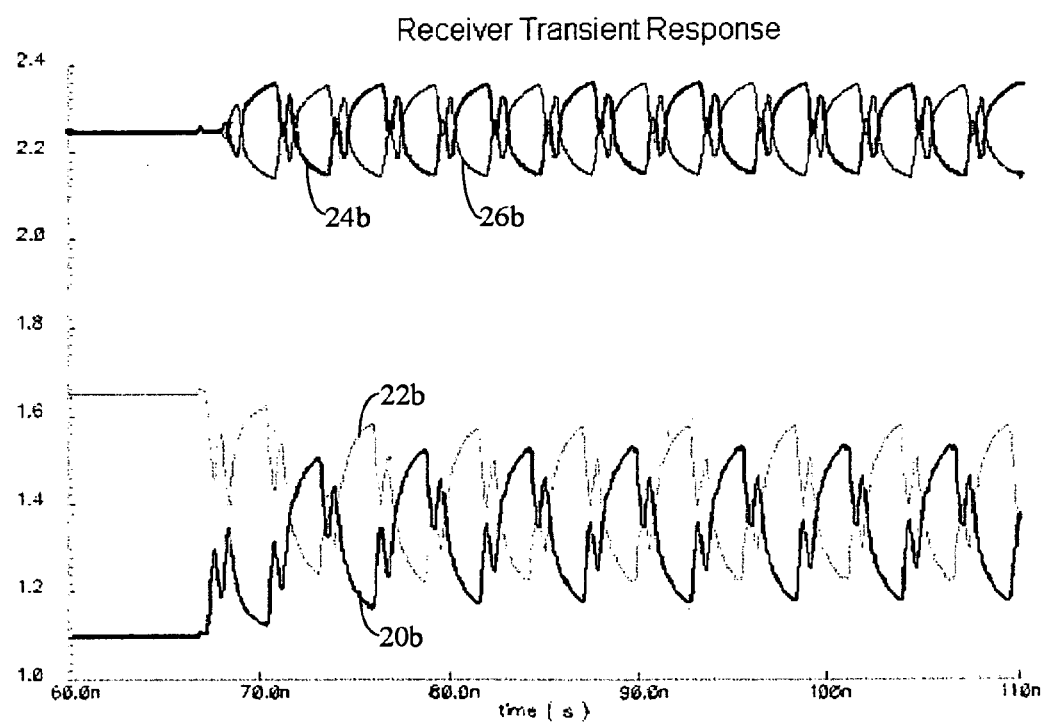
FIG. 6 is the resultant pulse shapes for both pairs of pulse in FIG. 5 upon traversing a transmission line at high frequencies.
Figure 7:
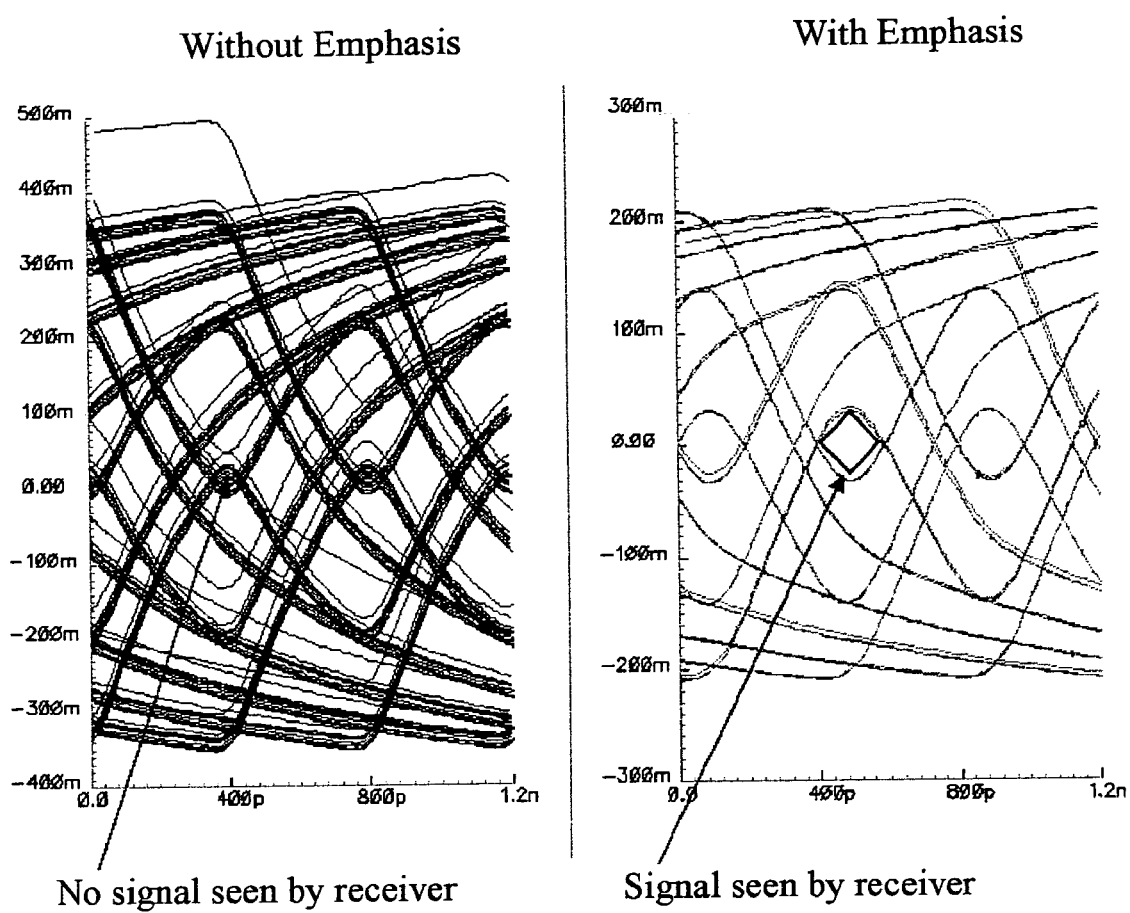
FIG. 7 is an eye diagram of the waveforms in FIG. 6.
Figure 8:
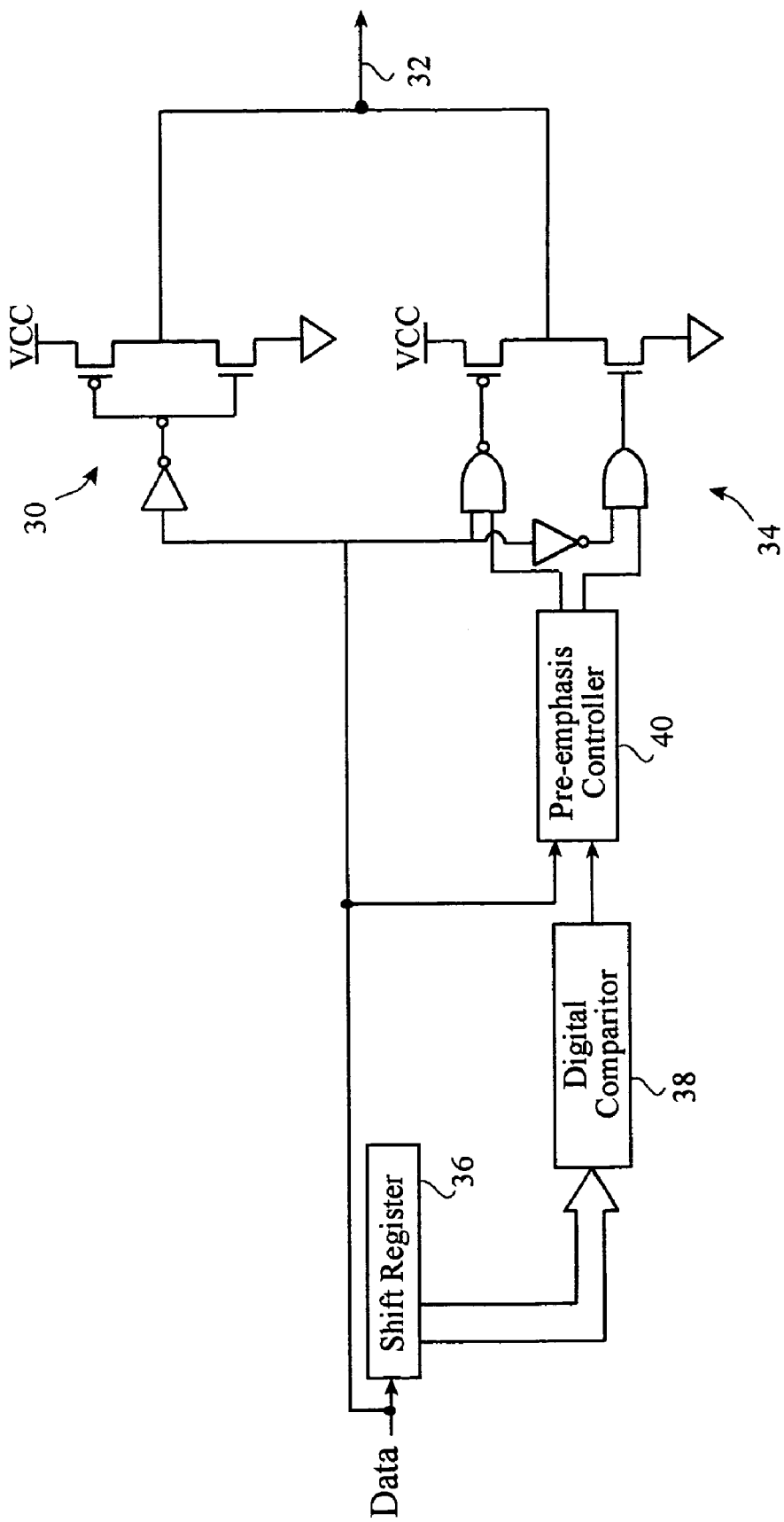
FIG. 8 is a prior art circuit for providing emphasis wave shaping to an output driver.
Figure 9:
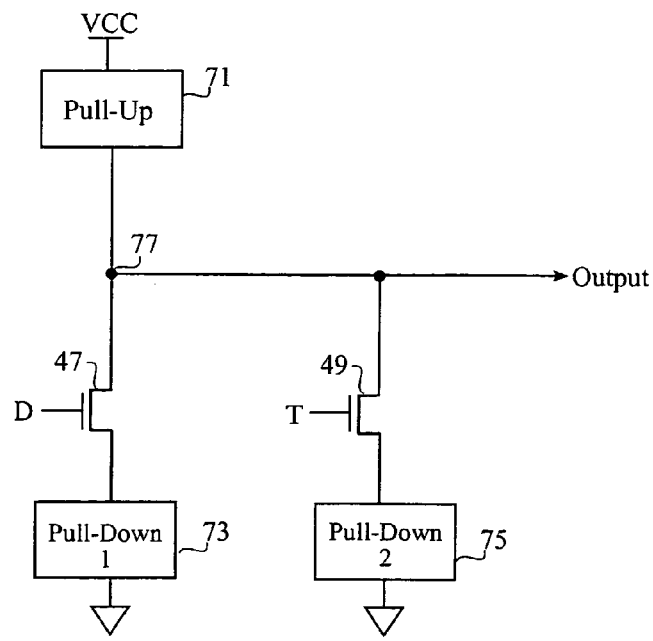
FIG. 9 is a simplified representation of an output driver in accord with the present invention.

With reference to FIG. 9, an output driver in accord with the present invention includes at least one pull-up component 71, two pull-down components 73 and 75, two transistor devices 47 and 49, and an output node 77. Pull-up component 71 is coupled between a first power rail, i.e. VCC, and output node 77, and may consist of a resistive device such as a pull-up resistor, not shown, for use in current-based circuitry, or alternatively consist of pull-up transistor, not shown. First transistor device 47 is preferably an NMOS transistor responsive to a first signal, D, for selectively coupling first pull-down component 73 to output node 77. Similarly, second transistor device 49 is preferably an NMOS transistor responsive to a second signal, T, for selectively coupling second pull-down component 75 to output node 77. Preferably first and second pull-down components 73 and 75 are tied to a second power rail, GND, and implemented as variable current sources of unequal strength for use as current sinks, or drains, as is explained more fully below. It is to be understood that pull-up component 71, first transistor device 47 and first pull-down component 73 constitute a first inverting amplifier in a voltage-follower configuration, and pull-up component 71, second transistor device 49 and second pull-down component 73 constitute a second inverting amplifier also in a voltage-follower configuration.

Pull-down device 75 is preferably relatively weak and unable to pull down node 77 to GND when transistor 49 is actuated. That is, pull-up component 71 is preferably strong enough to overcome pull-down component 45 and maintain output node 77 at a voltage potential representative of a logic high voltage level without emphasis. For example, if VCC is 4V, and transistor 49 is actuated while transistor 47 is turned off, only pull-down component 75 will be actively pulling down node 77, but since pull-up component 71 is stronger, output node 77 is only slightly lowered from VCC to a value representative of a logic high without emphasis, such as 3.3 V. Therefore, a non-emphasis logic high voltage is applied to node 77 by actuating transistor 49 while maintaining transistor 47 off.

Pull-down component 73 is stronger than pull-down component 75, but still weaker than pull-up component 71. That is, pull-down component 73 is preferably strong enough to pull output node 77 downward toward GND, but pull-up component 71 prevents node 77 from reaching GND. Therefore, when transistor 47 is actuated and transistor 49 is turned off, output node 77 is preferably pulled downward to a low voltage value representative of a logic low level without emphasis, i.e. a level higher than GND such as 0.7V.

In operation when no emphasis is desired, a non-emphasis logic high potential is placed on output node 77 by actuating transistor 49 while maintaining transistor 47 turned off. Similarly when no emphasis is desired, a non-emphasis logic low potential is placed on output node 77 by actuating transistor 47 while maintaining transistor 49 turned off. In effect, the placement of a non-emphasis logic high or logic low on output node 77 depends on both signal D and signal T. In the present case, placement of a non-emphasis logic high on output node 21 requires signals D and T to have values "1 0", respectively. Conversely, placement of a non-emphasis logic low on output node 77 requires signals D and T to have values of "0 1", respectively. In effect, non-emphasis logic levels are achieved by placing true logic signals on line D and complement logic signals on line T.

In order to place emphasis voltage levels on output node 77, pull-down component 73 and pull-down component 75 are made to function in unison. To place an emphasis logic high level signal on output node 77, transistors 47 and 49 are both turned off so as to cut-off both pull-down components 73 and 75 from output node 77. This permits pull-up component 71 to freely pull output node 77 all the way to VCC unimpeded. To put an emphasis level logic low on output node 77, transistors 47 and 49 are both turned on, i.e. actuated, to as to couple both pull-down components 77 and 79 to output node 77. As explained above, neither pull-down component 77 or 79 can singularly pull output node 77 all the way down, i.e. to GND, but working together pull-down components 73 and 75 can overcome pull-up component 71 and pull output node 77 down to an emphasis logic low voltage level, i.e. GND. Thus, placement of an emphasis logic high on output node 77 requires signals D and T to have matching values "0 0", respectively, and placement of an emphasis logic low on output node 77 requires signals D and T to have matching values of "1 1", respectively. In effect, emphasis logic levels are achieved by applying the same true logic signals to signals D and T.

In other words, when a emphasis is desired, such as when a logic transition is detected, signal T receives the same logic signal as signal D, and when no emphasis is desired, signal T receives the logic inverse of signal D.

Figure 10:
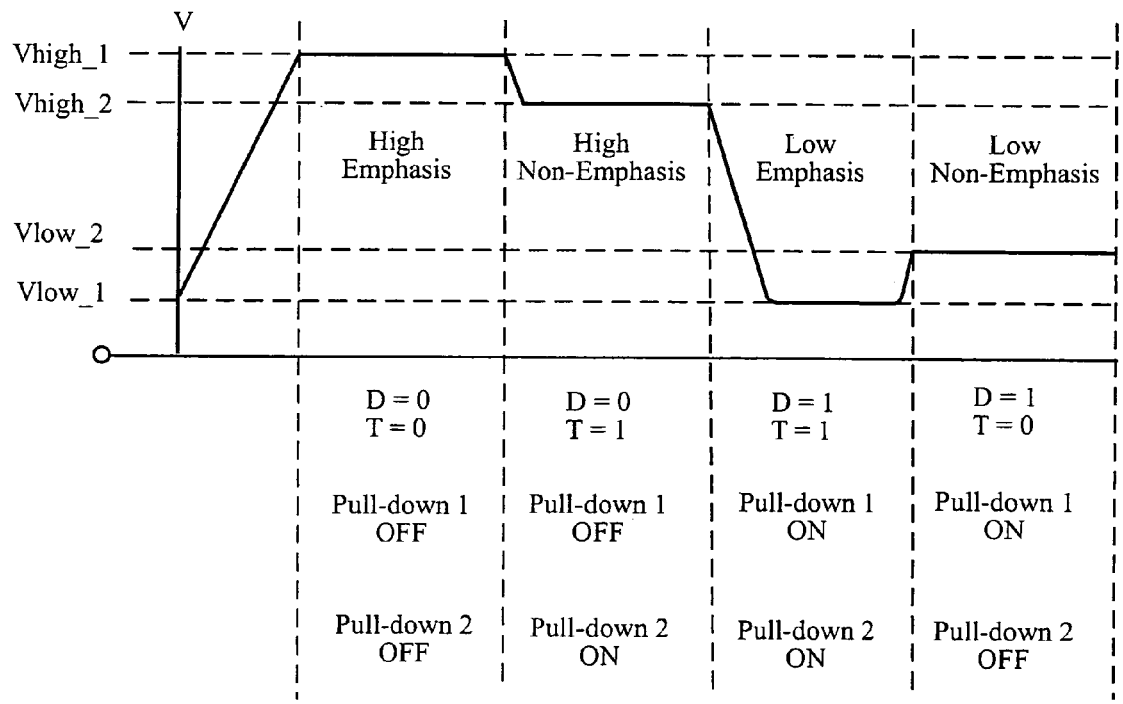
FIG. 10 illustrate waveforms with and without emphasis output from the driver of FIG. 9.

With reference to FIG. 10, a pictorial representation of the operation of the output driver of FIG. 9, indicates two logic high voltage values (Vhigh_1 and Vhigh_2) and two logic low voltage values (Vlow_1 and Vlow_2). Vhigh_1 represents the emphasis voltage high level, and Vhigh_2 represents the non-emphasis voltage high level. Vlow_1 represented the emphasis voltage low level, and Vlow_2 represents the non-emphasis voltage low level. Four modes of operations are illustrated. Firstly, a logic high emphasis level is achieved by assigning "0" to both signals D and T resulting in pull-down components 73 and 75 both being cut-off from output node 77. Secondly, a logic high non-emphasis level is achieved by assigning "0" to signal D and assigning the logic complement "1" to signal T resulting in second pull-down component 75 being coupled to output node 77 and first pull-down component 73 being cut-off from output node 77. As explained above, second pull-down component 75 is effective for lowering the potential of output node 77, but is not strong enough to singularly bring output node 77 to a logic low level. In the third mode of operation, a logic low emphasis level is achieved by assigning "1" to both signals D and T resulting in first and second pull-down components 73 and 75 both being coupled to output node 77, and both actively pulling down output node 77. Lastly, a logic low non-emphasis level is achieved by assigning "1" to signal D and assigning the inverse, "0", to signal T resulting in first pull-down component 73 being coupled to output node 77 and second pull-down component 75 being cut-off from output node 77. As explained above, first pull-down component 73 is effective for lowering the potential of output node 77 to a non-emphasis logic low level, but is not strong enough to singularly bring output node 77 to an emphasis logic low level.

Figure 11:
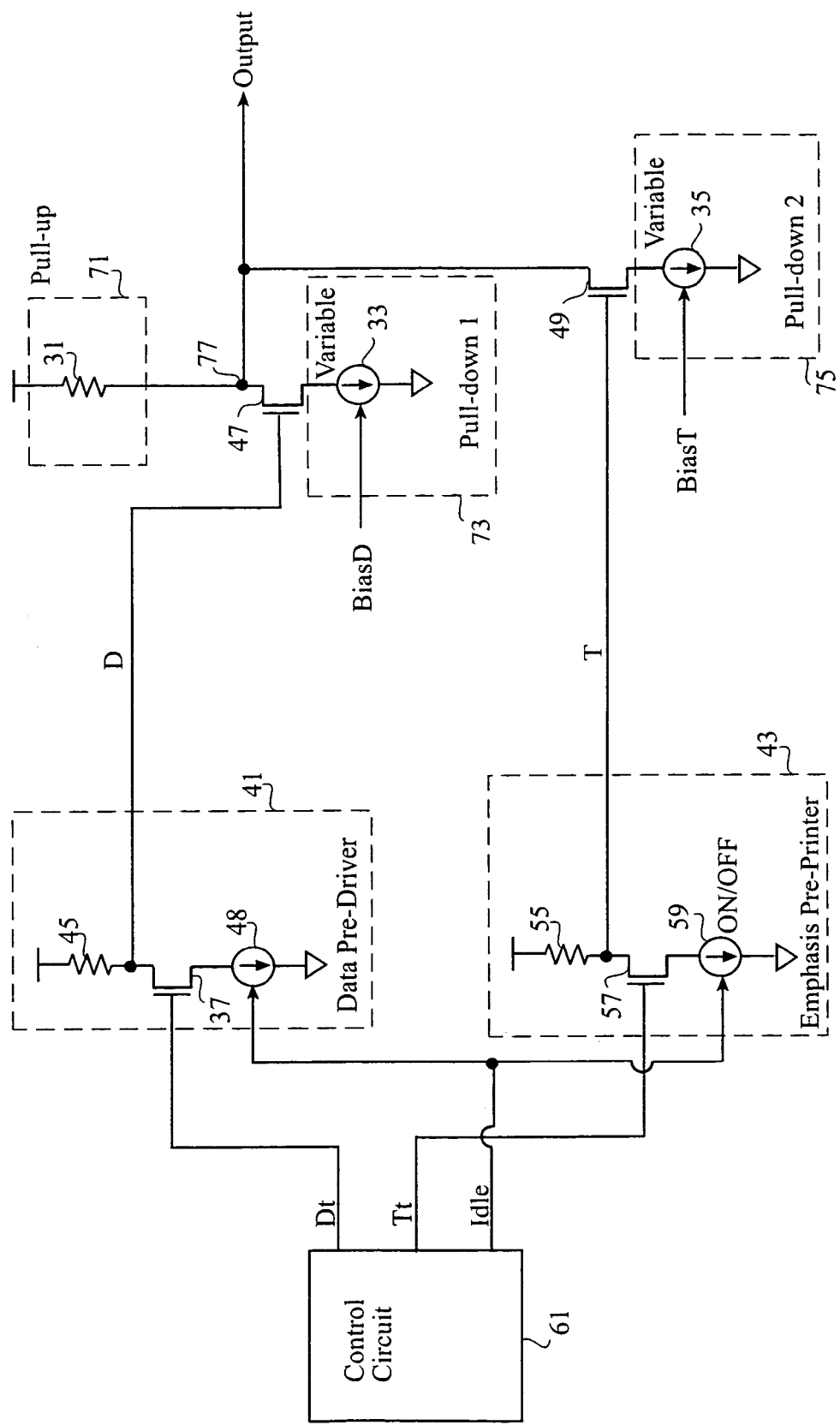
FIG. 11 is simplified circuit structure of the output driver of FIG. 9.

With reference to FIG. 11, all elements similar to those of FIG. 9 have similar reference characters, and are explained above. In the present case, pull-up component 71 is shown embodied by a pull-up resistor 31. First pull-down component 73 is embodied by a variable current source 33, whose current sourcing magnitude is controlled by a first bias signal BiasD. Second pull-down component 75 is embodied by a second variable current source 35, whose current sourcing magnitude is controlled by a second bias signal BiasT. As before, transistor 47 is responsive to signal D and transistor 49 is response to signal T.

Additionally shown in FIG. 11, are pre-drivers 41 and 43, which respectively output signals D and T. Pre-driver 41 includes pull-up resistor 45, transistor 37 and current source 48. Pre-driver 43 includes pull-up resistor 55, transistor 57 and current source 59. Pre-driver 41 and Pre-driver 43 are both controlled by a control circuit 61 that outputs a data signal Dt coupled to the control gate of transistor 37, a transition data signal Tt coupled to the control gate of transistor 57, and a signal Idle coupled to selectively turn ON and OFF current sources 48 and 59. Thus, pre-drivers 41 and 43 selectively activate and deactivate the output drivers in response to signals Dt and Tt when signal Idle has current sources 48 and 59 turned ON, but when control circuit 61 turns OFF current sources 48 and 59, pull-up resistors 45 and 55 respectively pull signals D and T up toward VCC irrespective of the value of signals Dt and Tt.

The present discussion has so far shown on output driver and one set of pre-drivers, but as explained above, the present output driver is preferably for use in a differential transmission environment. Therefore, two set of complementary output drivers and pre-drivers are needed to implement a differential output driver in accord with the present invention.

Figure 12:
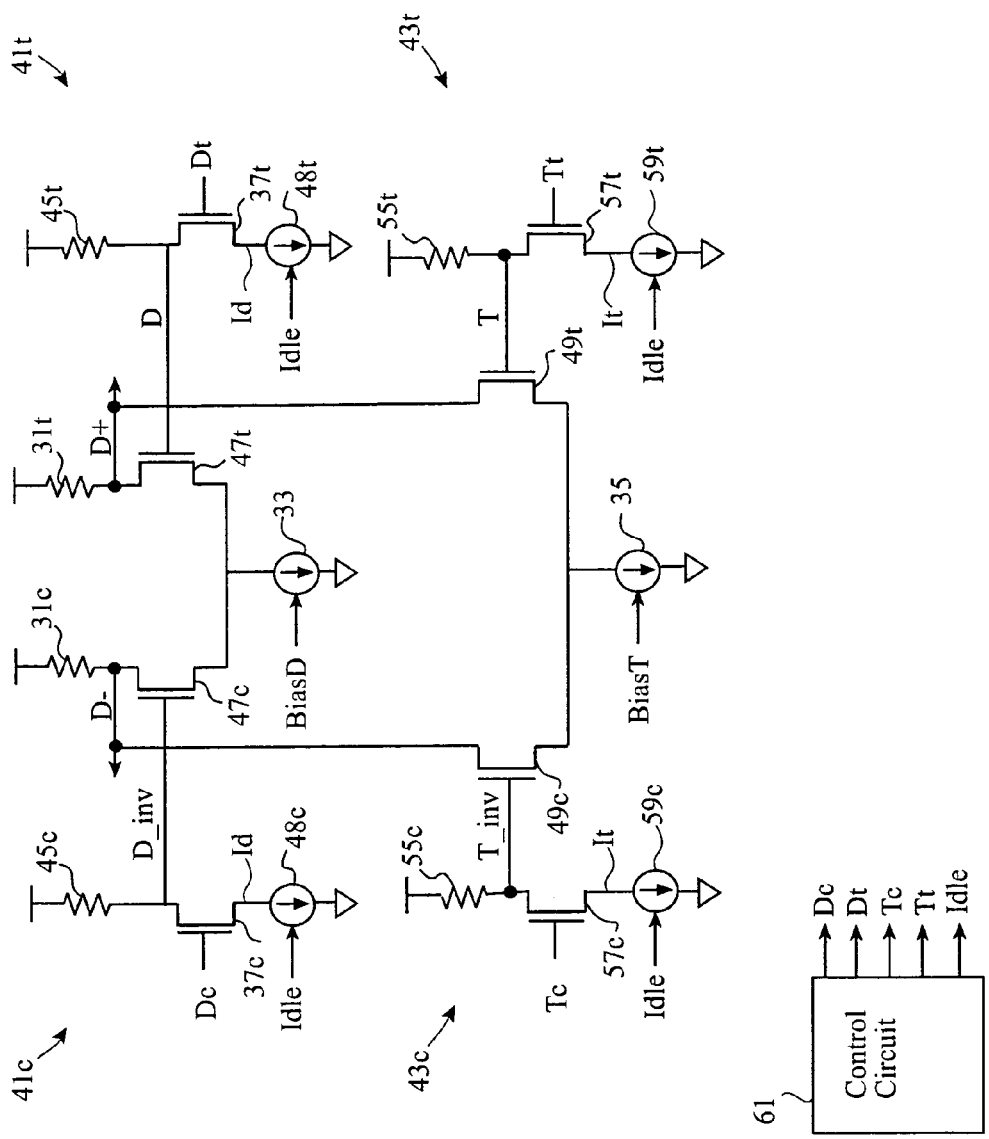
FIG. 12 is a more complete differential circuit representation of the driver of FIG. 9.

With reference to FIG. 12, all elements similar to those of FIG. 11 have similar reference characters with the exemption that when two sets of logic-inverse circuits are needed to implement true and complement tasks, elements are distinguish with the addition of a suffix designator, i.e. "T" for true and "C" for complement. For example, resistor 31T, transistor 47T, and current source 33 correspond to resistor 31, transistor 47, and current source 33 of FIG. 11, and implement the true function of the output driver to output true data signal D+. Similarly, resistor 31C, transistor 47C, and current source 33 correspond to pull-up resistor 31, transistor 47, and current source 33 of FIG. 11, and together implement the complementary function to output complement signal D−. It is to be noted that both the true and complement output driver circuit components 31T/C and 47C/T share the same current source 33 for the sake of simplicity. It is to be understood that separate current sources could be implemented, if desired. Likewise, transistors 49T and 49C implement the true and complement equivalent behavior as transistor 49 in FIG. 11. Both transistors 49T and 49C share current source 35.

Pre-driver 41T outputs signal D coupled to transistor 47T, and Pre-driver 43T outputs signal T coupled to transistor 49T. Pre-driver 41T includes pull-up resistor 45T, transistor 37T, and current source 48T, and pre-driver 41T is responsive to signal Dt from control circuit 61. Pre-driver 43T includes pull-up resistor 55T, transistor 57T, and current source 59T, and pre-driver 43T is responsive to signal Tt from control circuit 61.

Similarly, pre-driver 41C outputs inverse signal D_inv coupled to transistor 47C, and pre-driver 43C outputs inverse signal T_inv coupled to transistor 49C. Pre-driver 41C includes pull-up resistor 45C, transistor 37C, and current source 48C, and pre-driver 41C is responsive to signal Dc from control circuit 61. Pre-driver 43C includes pull-up resistor 55C, transistor 57C, and current source 59C, and pre-driver 43C is responsive to signal Tc from control circuit 61.

In the present example, pre-driver current source 48T/48C and 59T/59C are shown separately, but they may combined, as appropriate. For example, current sources 48T and 48C are shown to provide current value Id, and current sources 59T and 59C are shown to provide current value It. Thus, current sources 48T and 48C may preferably be combined, and current sources 59T and 59C may preferably be combined. Current sources 48C/T and 59C/T are shown to be selectively turned on and off by signal Idle from control circuit 61 to selectively force signals D, T, D_inv, and T_inv to a logic high during idle states.

As shown, control circuit 61 issues all control singles, as appropriate, to output a logic high or logic low signal with or without emphasis, as necessary. Specifically, control circuit 61 outputs signals Dt, Dc, Tt, Tc, It, and Ic. Although the routing of these signals is not shown, it is to be understood that they are routed to their appropriate input as indicated by signal labels.

As explained above, the current sourcing strength of current sources 33 and 35 is determined by their respective bias signals, BiasD and BiasT, to establish emphasis and non-emphasis signal swings and magnitude levels. In the presently preferred embodiment, it is desirable that the present circuit additionally be able to output a constant current value mid-way between a logic high and a logic low level. This is obtainable by appropriately adjusting the bias signals so as to assure that they balance the pull-up strength of pull-up resistors 31T and 31C, and assuring that transistors 47T and 47C and/or transistors 49T and 49C remain actuated irrespective of the logic values of signals D, T, D_inv, and T_inv. Control circuit 61 determines whether the present output driver outputs a constant value during idle conditions, as explained more fully below.

Figure 13:
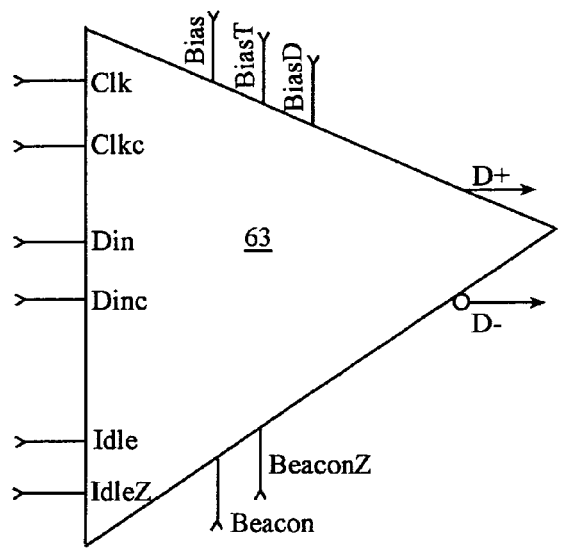
FIG. 13 is a symbolic representation of the circuit of FIG. 12.

With reference to FIG. 13, the electronic symbol for a differential signal driver 63 in accord with the present invention has differential inputs for clock, data, idle, and beacon signals. The bias input is a current reference for the logic circuits and the biasT and biasD are current references that set the output swing and de-emphasized levels, as explained above. Driver 63 outputs complementary signals D+ and D−. The complementary idle inputs, Idle and IdleZ, will force the complementary outputs D+ and D− to the same voltage level, which preferably is the midpoint of the logic high and logic low levels. The complementary beacon signals, Beacon and BeaconZ, cause the outputs to only swing at non-emphasis levels irrespective of logic transitions, in effect disabling the emphasis function.

Figure 14:
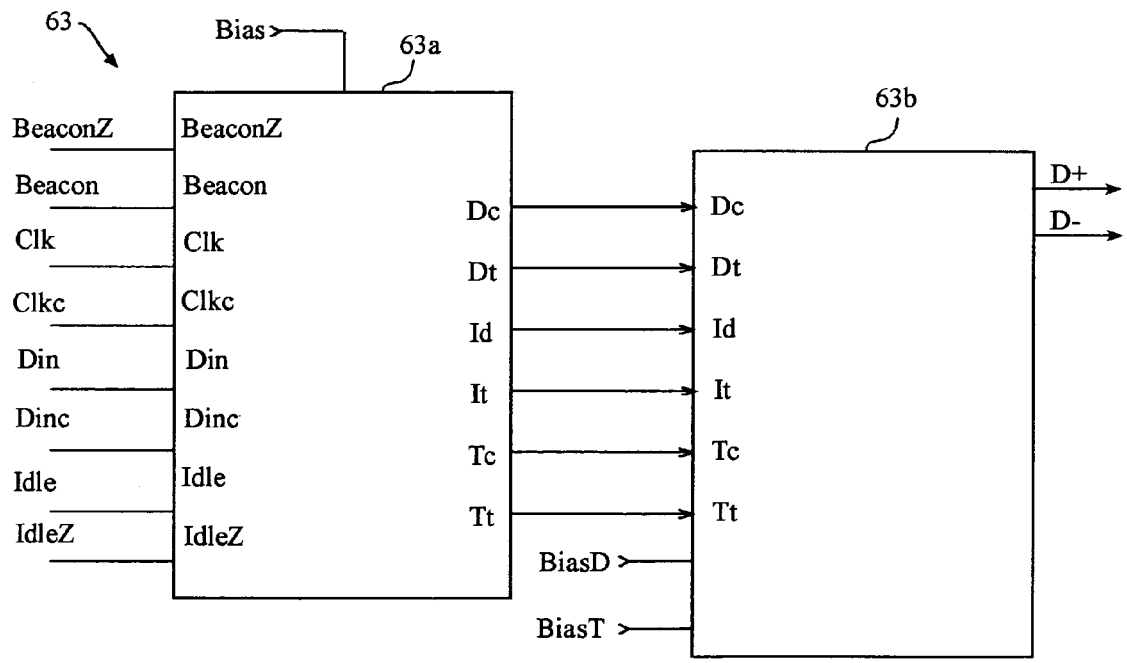
FIG. 14 is a block structure of the internal structure of symbolic representation of FIG. 13.

With reference to FIG. 14, output driver 63 is preferably composed of 2 sub-blocks, 63a and 63b. The first sub-block 63a contains logic circuits that control the output driver section 63b and its voltage levels. In effect, the first sub-block 63a implements many of the control circuit functions, as explained above in reference to block 61. The second sub-block 63b drives the voltages onto the transmission lines. Basically, the second sub-block 63b implements many of the signal driver functions, explained above in reference to the discussion of the signal driver and pre-driver. It is to be noted, however, that current magnitudes Id and It, where were provided by current sources 48C/48T and 59T/59C, respectively, in FIG. 12 are preferably supplied by first block 63a.

Figure 15:
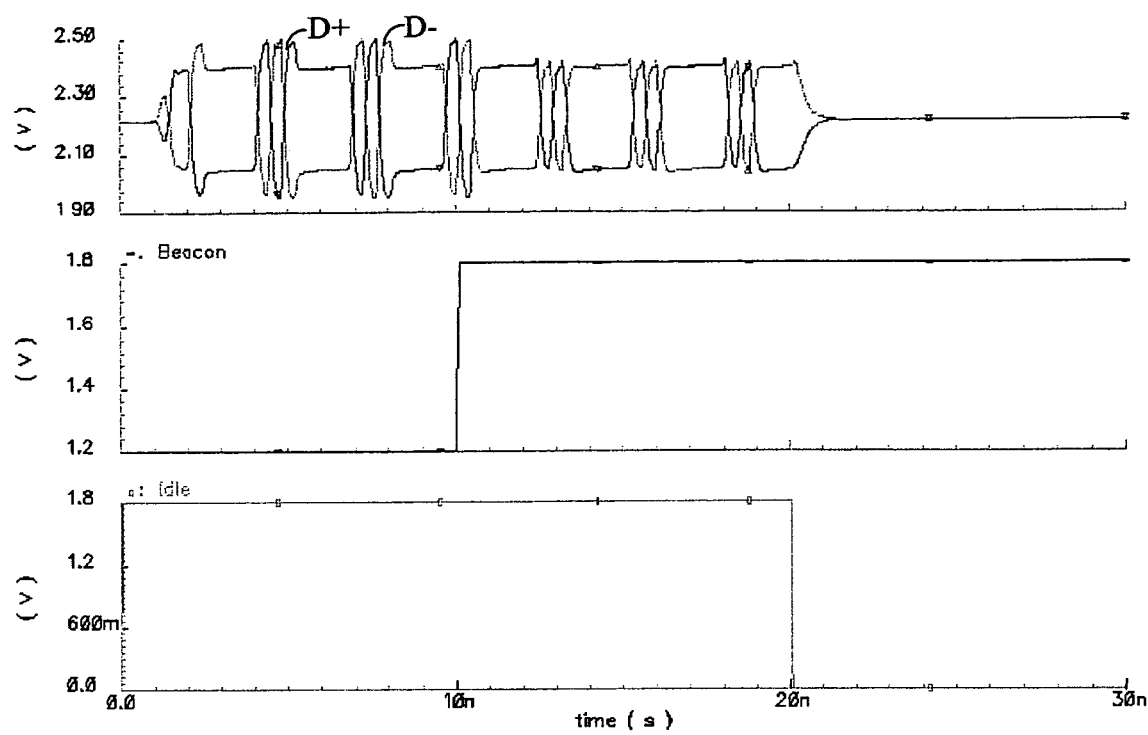
FIG. 15 is an exemplary operation of the structure of FIG. 13.

In FIG. 15, operation of the idle and beacon control signals and their interaction with the operation of the output driver is illustrated. Although the true and complement output data signals D+ and D− are shown, for the sake of clarity only the true component of each pair of complementary control signals Beacon and Idle is shown. It is to be understood that signals Beacon and Idle have associated complementary signals, BeaconZ and IdleZ, whose values are the inverse logic of those shown. When signal Beacon rises to a logic high at time 10 nsec, the emphasis operation of the output driver is disabled and the output signals D+ and D− switch between non-emphasis levels. While signal Idle is at a high level, outputs D+ and D− switch normally, with or without emphasis as determine by signal Beacon. However, when signal Idle is low (at times 0 nsec and 20 nsec), outputs D+ and D− are driven to the average DC level of the signals, i.e. the midpoint between logic high and logic low levels.

Figure 16A:
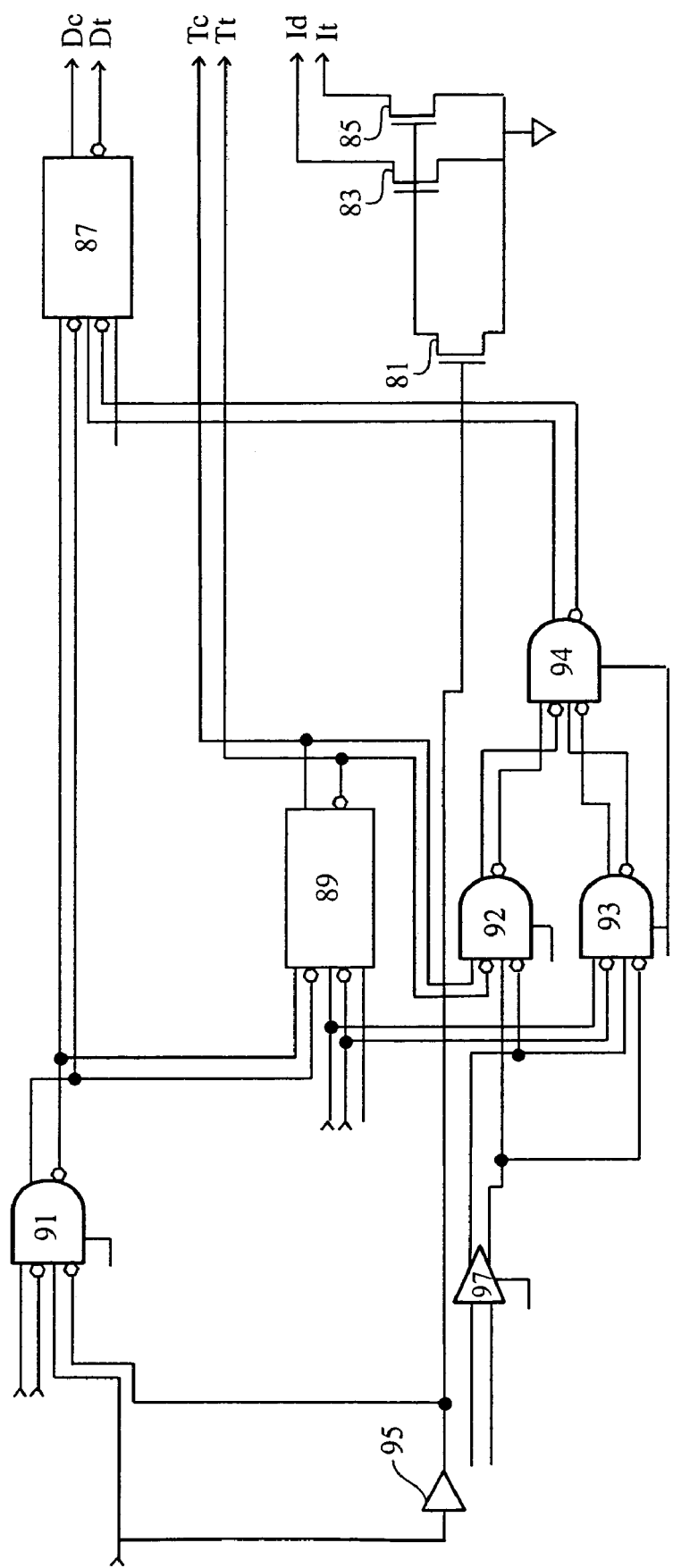
FIG. 16*a* is an internal view of block 63*a* of FIG. 14.
Figure 16B:
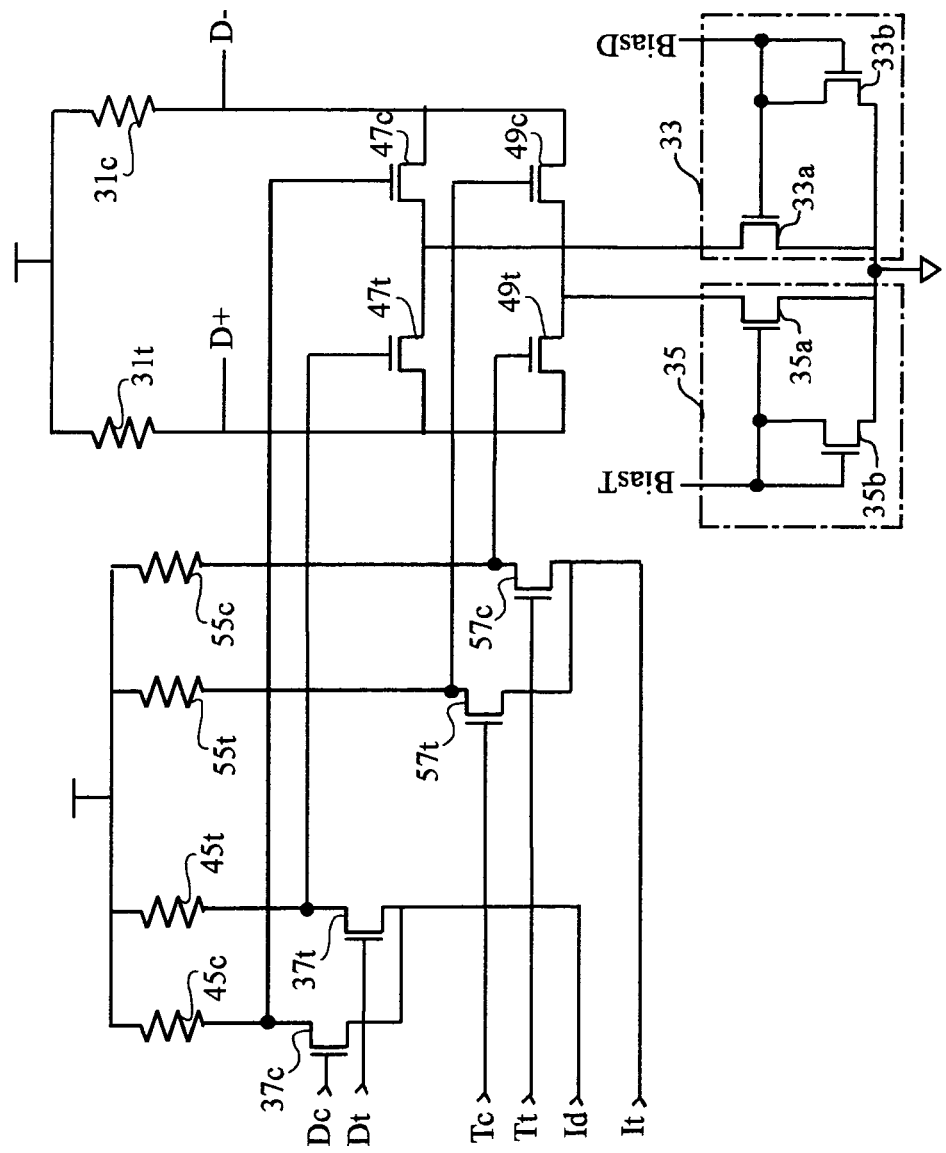
FIG. 16*b* is an internal view of block 63*b* of FIG. 14.

FIGS. 16A and 16B provide internal views of blocks 63a and 63b, respectively. As shown in FIG. 16A, the pre-driver current sources 48T/48C and 59T/59C of FIG. 12 are combined into a single current sources 83 and 85, respectively. Current sources 83 and 85 may be selectively turned on and off by means of switch 81. In this manner, the operation of the pre-drivers shown in FIG. 16B can be directly controlled from the control circuitry in FIG. 16A.

With reference to FIG. 16B, a more compact view of the structure of FIG. 12 in accord with the present invention shows current sources 33 and 35 implemented as transistor structures. All elements in FIGS. 16A and 16B similar to those of FIGS. 9 to 12 are given similar reference characters and are described above. Current source 33 is implemented as a first transistor 33a whose default current sourcing capacity is controlled by diode-connected transistor 33b. The current sourcing capability of transistor 33a may further be modulated by signal BiasD to assure appropriate voltage swing and voltage level behavior, as explained above.

Similarly, current source 35 is implemented as a first transistor 35a whose default current sourcing capacity is controlled by diode-connected transistor 35b. The current sourcing capability of transistor 33a may further be modulated by signal BiasT to assure appropriate voltage swing and voltage level behavior, as explained above.

The current source value of the pre-drivers is provided by lines Id and It from sub-block 63a. When operating in normal mode, lines Id and It preferably provide a current sourcing value to permit normal operation of the pre-drivers, as discussed above. That is, transistors 37C and 37T will respond to signal Dc and Dt to apply the appropriate pre-driver signal to output driver transistors 47C and 47T. Preferably when emphasis is not necessary, signals Tc and Tt receive the logic complement of signals Dc and Dt so that during non-emphasis operation, transistor 47C will be actuated while transistor 49C is de-actuated and transistor 47T will be actuated while transistor 49T is de-actuated, and vise versa. That is, when a logic low is desired on line D− transistor 47C is actuated to bring line D− a non-emphasis logic low level, and transistor 49c is de-actuated so as to not boost the pull-down action on line D−. During this operation, a complementary non-emphasis logic high would be desirable on line D+. Therefore, transistor 47T would be de-actuated to isolate line D+ from pull-down current source 33, but transistor 49T would be actuated to couple line D+ to second (and smaller) current source 35. As explained above, the current source capability of current source 35 is much lower (preferably 3 times smaller) than that of current source 33, and preferably has a value sufficient to slightly pull-down line D+ to a non-emphasis logic high value, below Vcc.

Conversely, when an emphasis logic low is desired on line D−, signals Tc/Tt are made to match signals Dc/Tc so as to boost the voltage levels on lines D+ and D−. For example, when an emphasis logic low is desired on line D−, both transistors 47C and 49C would be simultaneously actuated and line D− would therefore be coupled to both current source 33 and 35 by both transistor 47C and 49C. As explained above, the dual pull-down action of current sources 33 and 35 operating together are sufficient for pulling line D− to an emphasis logic low level, such as a GND. During this time, an complement emphasis logic high would be desirable on line D+. Since transistors 47T and 49T would be operating in unison, both would be off and pull-up resistor 31T would be free to pull line D+ to a higher emphasis level of VCC, for example, without any counter-acting action from current sources 33 or 35.

During idle operation, however, it is desirable that both true and complement lines D+ and D− have a common value mid-way between logic high and logic low values irrespective of the data values of signals Dc, Dt, Tc, and Tt. Therefore, during idle operation, pull-down lines Id and It are preferably cut-off from ground and made to have a high impedance, i.e. tri-state condition. As a result, no pull-down action will be available to transistors 37C, 37T, 57C, or 57T. Therefore, signals D, D_inv, T, and T_inv will all be pulled up by pull-up resistors 45T, 45C, 55T, and 55C irrespective of the data values of signals Dc, Dt, Tc, or Tt. This will cause transistors 47C, 47T, 49C, and 49T to all be simultaneously actuated. Under normal operation, this would cause lines D+ and D− to both be pulled down to the emphasis logic low level, but during Idle conditions, it is preferred that signals BiasT and BiasD both be adjusted so that the pull-down capacity of current sources 35 and 33 are made to balance the pull-up action of pull-up resistors 31T and 31C so that lines D+ and D− both travel to a value mid-way between logic high and logic low values. This may be achieved by sizing diode connected transistors 33b and 35b, and pull-down transistors 33a and 35a to provide this current sourcing capacity when signals BiasT and BiasD are tri-stated. In this manner, the correct current sourcing capacity can quickly obtained by simply decoupling the bias voltage values applied to lines BiasT and BiasC. On the other hand, the voltage values applied to lines BiasT and BiasC my simply be switched to appropriate values to obtaining the desired current sourcing capacity for current sources 35 and 33 to provide the appropriate output value on lines D+ and D−. Alternatively, the values of signals BiasT and BiasD may remain unchanged if resistors 31T and 31C are sized such that their combined current paths to VCC are sufficient to bring lines D+ and D− to a value mid-way between VCC and GND in spite of the combined pull-down action of current sources 33 and 35.

In FIG. 16A, two latches 87 and 89, and control logic consisting of four complementary logic AND gates 91-94, an inverter 95, and a complementary tri-state buffer 97 provide appropriate logic levels for signals Dc, Dt, Ic, and It, and proper operation for lines Id and It, in accordance with a desired operation.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A signal driver, comprising:
  a first voltage power rail;
  a second voltage power rail having a voltage level lower than said first voltage power rail;
  an output driver having:
    a first pull-up device coupled between said first voltage power rail and an output node;
    a first pull-down device coupled to said second voltage power rail;
    a second pull-down device coupled to said second voltage power rail;
    a data switching device responsive to a data signal for selectively coupling said output node to said first pull-down device;
    an emphasizing switching device responsive to an emphasizing signal for selectively coupling said output node to said second pull-down device;

wherein said data switching device and emphasizing switching device operate singularly and simultaneously to produce at said output node a first and second logic high voltage level and produce a first and second logic low voltage level;

a data pre-driver having an active state and an inactive state, said active state being effective for selectively actuating and de-actuating said data signal at said data switching device in response to a data control signal, said inactive state being effective maintaining said data signal actuated at said data switching device irrespective of said data control signal; and an emphasis pre-driver having an active state and an inactive state, said active state being effective for selectively actuating and de-actuating said emphasis signal at said emphasis switching device in response to an emphasis control signal, said inactive state being effective maintaining said emphasis signal actuated at said emphasis switching device irrespective of said emphasis control signal;

wherein:

said data pre-driver includes a pre-data pull-up device coupled between said first voltage power rail and an intermediate data output node for producing said data signal, a first a pre-data switching device for selectively coupling said intermediate data output node to a pre-data pull-down node, and a controllable pre-data pull-down device for selectively maintaining said pre-data pull-down node electrically floating or coupled to said second voltage power rail in response to an idle signal;

said emphasis pre-driver includes a pre-emphasis pull-up device coupled between said first voltage power rail and an intermediate emphasis output node for producing said emphasis signal, a first a pre-emphasis switching device for selectively coupling said intermediate emphasis output node to a pre-emphasis pull-down node, and a controllable pre-emphasis pull-down device for selectively maintaining said pre-emphasis pull-down node electrically floating or coupled to said second voltage power rail in response to said idle signal; and said intermediate data output node and said intermediate emphasis output node are respectively raised toward said first voltage power rail by said pre-data pull-up device and said pre-emphasis pull-up device, irrespective of said data control signal and emphasis control signal when said idle signal is actuated causing said pre-emphasis pull-down node and pre-data pull-down node to be floating.

2. The signal driver of claim 1, wherein:

said first logic high voltage level is higher than said second logic high voltage level;

said first logic high level being produced by said data switching device and emphasizing switching device simultaneously decoupling said first and second pull-down devices from said output node;

said second logic high level being produced by said emphasizing switching device coupling said second pull-down device to said output node while said data switching device maintains said first pull-down device decoupled from said output node.

3. The signal driver of claim 1, wherein:

said first logic low voltage level is lower than said second logic low voltage level;

said first logic low level being produced by said data switching device and emphasizing switching device simultaneously coupling said first and second pull-down devices to said output node;

said second logic low level being produced by said data switching device coupling said first pull-down device to said output node while said emphasizing switching device maintains said second pull-down device decoupled from said output node.

4. The signal driver of claim 1, wherein said pre-data pull-down device and pre-emphasis pull-down device are both current sources each having respective on/off inputs.

5. The signal driver of claim 1, further having control circuitry for producing said data control signal, emphasis control signal, and idle signal, said control circuitry being effective for:

causing said output node to output said first and second logic high voltage level or first and second logic low voltage levels when new data to be output requires a logic level transition at said output node;

causing said output node to output only said second logic high voltage level or only said second logic low voltage level when new data to be output requires no logic level transition at said output node;

in response to a beacon signal, causing said output node to output only said second logic high voltage level or only said second logic low voltage level in accordance with new data to be output requiring a logic level transition at said output node; and issuing said idle signal when no data is to be output, and thereby causing said output node to move to a voltage mid-way between said first and second voltage power rails.

6. The signal driver of claim 1, wherein said first and second pull-down devices are respective first and second current sources, and said pull-up device is a pull-up resistor.

7. The signal driver of claim 1, wherein said output driver is a first output driver, and said signal driver further comprises a second of said output driver for producing data complementary to said first output driver.

8. A signal driver comprising:

a first voltage power rail;

a second voltage power rail having a voltage level lower than said first voltage power rail;

a first output driver having:

a first pull-up device coupled between said first voltage power rail and a first output node;

a data pull-down device coupled to said second voltage power rail;

a emphasis pull-down device coupled to said second voltage power rail;

a first data switching device responsive to a first data signal for selectively coupling said first output node to said data pull-down device; and a first emphasizing switching device responsive to a first emphasizing signal for selectively coupling said first output node to said emphasis pull-down device;

wherein said first data switching device and first emphasizing switching device operate singularly and simultaneously to produce at said output node a first and second logic high voltage level and produce a first and second logic low voltage level; and a second output driver having:

a second pull-up device coupled between said first voltage power rail and a second output node;

a second data switching device responsive to a second data signal for selectively coupling said second output node to said data pull-down device, said second data signal being the logic complement of said first data signal; and a second emphasizing switching device responsive to a second emphasizing signal for selectively coupling said second output node to said emphasis pull-down device, said a second emphasizing signal being the logic complement of said a first emphasizing signal;

wherein said second data switching device and second emphasizing switching device operate singularly and simultaneously to produce at said second output node said first and second logic high voltage level and produce said first and second logic low voltage level;

a first data pre-driver having an active state and an inactive state, said active state being effective for selectively actuating and de-actuating said first data signal at said first data switching device in response to a first data control signal, said inactive state being effective maintaining said first data signal actuated at said first data switching device irrespective of said first data control signal;

a first emphasis pre-driver having an active state and an inactive state, said active state being effective for selectively actuating and de-actuating said first emphasis signal at said first emphasis switching device in response to a first emphasis control signal, said inactive state being effective maintaining said first emphasis signal actuated at said first emphasis switching device irrespective of said first emphasis control signal;

a second data pre-driver having an active state and an inactive state, said active state being effective for selectively actuating and de-actuating said second data signal at said second data switching device in response to a second data control signal, said inactive state being effective maintaining said second data signal actuated at said second data switching device irrespective of said second data control signal, said second data control signal being the logic complement of said first data control signal;

a second emphasis pre-driver having an active state and an inactive state, said active state being effective for selectively actuating and de-actuating said second emphasis signal at said second emphasis switching device in response to a second emphasis control signal, said inactive state being effective maintaining said second emphasis signal actuated at said second emphasis switching device irrespective of said second emphasis control signal, said second emphasis control signal being the logic complement of said first emphasis control signal.

9. The signal driver of claim 8, wherein:

said first logic high voltage level is higher than said second logic high voltage level;

said first logic high level being produced by:
said first data switching device and first emphasizing switching device simultaneously decoupling said data pull-down device and emphasis pull-down device from said first output node, or by
said second data switching device and second emphasizing switching device simultaneously decoupling said data pull-down device and emphasis pull-down device from said second output node;

said second logic high level being produced by:
said first emphasizing switching device coupling said emphasizing pull-down device to said output node while said first data switching device maintains said data pull-down device decoupled from said first output node; or by
said second emphasizing switching device coupling said emphasizing pull-down device to said output node while said second data switching device maintains said pull-down device decoupled from said second output node.

10. The signal driver of claim 8, wherein:

said first logic low voltage level is lower than said second logic low voltage level;

said first logic low level being produced by said first data switching device and first emphasizing switching device simultaneously coupling said data pull-down device and emphasis pull-down device to said first output node, or by said second data switching device and second emphasizing switching device simultaneously coupling said data pull-down device and emphasis pull-down device to said second output node;

said second logic low level being produced by said first data switching device coupling said data pull-down device to said first output node while said first emphasizing switching device maintains said emphasis pull-down device decoupled from said first output node.

11. The signal driver of claim 8, wherein:

said first data pre-driver includes a first pre-data pull-up device coupled between said first voltage power rail and a first intermediate data output node for producing said first data signal, a first a pre-data switching device for selectively coupling said first intermediate data output node to a first pre-data pull-down node, and a controllable first pre-data pull-down device for selectively maintaining said first pre-data pull-down node electrically floating or coupled to said second voltage power rail in response to an idle signal;

said first emphasis pre-driver includes a first pre-emphasis pull-up device coupled between said first voltage power rail and a first intermediate emphasis output node for producing said first emphasis signal, a first pre-emphasis switching device for selectively coupling said first intermediate emphasis output node to a first pre-emphasis pull-down node, and a first controllable pre-emphasis pull-down device for selectively maintaining said first pre-emphasis pull-down node electrically floating or coupled to said second voltage power rail in response to said idle signal;

said first intermediate data output node and said first intermediate emphasis output node are respectively raised toward said first voltage power rail by said first pre-data pull-up device and said first pre-emphasis pull-up device, irrespective of said first data control signal and emphasis control signal when said idle signal is actuated causing said first pre-emphasis pull-down node and first pre-data pull-down node to be floating;

said second data pre-driver includes a second pre-data pull-up device coupled between said first voltage power rail and a second intermediate data output node for producing said second data signal, a first a pre-data switching device for selectively coupling said second intermediate data output node to a second pre-data pull-down node, and a controllable second pre-data pull-down device for selectively maintaining said second pre-data pull-down node electrically floating or coupled to said second voltage power rail in response to an idle signal;

said second emphasis pre-driver includes a second pre-emphasis pull-up device coupled between said first voltage power rail and a second intermediate emphasis output node for producing said second emphasis signal, a second pre-emphasis switching device for selectively coupling said second intermediate emphasis output node to a second pre-emphasis pull-down node, and a second controllable pre-emphasis pull-down device for selectively maintaining said second pre-emphasis pull-down node electrically floating or coupled to said second voltage power rail in response to said idle signal;

said second intermediate data output node and said second intermediate emphasis output node are respectively raised toward said first voltage power rail by said second pre-data pull-up device and said second pre-emphasis pull-up device, irrespective of said second data control signal and emphasis control signal when said idle signal is actuated causing said second pre-emphasis pull-down node and second pre-data pull-down node to be floating.

12. The signal driver of claim 11, wherein said first and second pre-data pull-down device and first and second pre-emphasis pull-down device are current sources, each having respective on/off inputs.

13. The signal driver of claim 11, further having control circuitry for producing said first and second data control signals, first and second emphasis control signals, and idle signal, said control circuitry being effective for:

causing said first and second output nodes to output said first and second logic high voltage levels or first and second logic low voltage levels when new data to be output requires a logic level transition at said first and second output nodes;

causing said first and second output nodes to output only said second logic high voltage level or only said second logic low voltage level when new data to be output requires no logic level transition at said output node;

in response to a beacon signal, causing said first and second output nodes to output only said second logic high voltage level or only said second logic low voltage level in accordance with new data to be output requiring a logic level transition at said output node; and issuing said idle signal when no data is to be output, and thereby causing said first and second output nodes to move to a voltage mid-way between said first and second voltage power rails.

14. The signal driver of claim 8, wherein said data pull-down device and said emphasis pull-down device are current sources, and said first and second pull-up devices are a pull-up resistor.

* * * * *